United States Patent [19]
Rahal-Arabi et al.

[11] Patent Number: 5,438,297
[45] Date of Patent: Aug. 1, 1995

[54] ELECTRICAL TRACE HAVING A CLOSED LOOP CONFIGURATION

[75] Inventors: Tawfik Rahal-Arabi, Hillsboro; Real Pomerleau, Aloha; Martin Rausch, Manning; Tim Schreyer, Hillsboro, all of Oreg.

[73] Assignee: Intel Corporation, Santa Clara, Calif.

[21] Appl. No.: 998,937

[22] Filed: Dec. 30, 1992

[51] Int. Cl.⁶ .............................................. H01L 25/00
[52] U.S. Cl. ................................ 327/565; 327/293; 327/295; 327/564; 361/784; 361/729
[58] Field of Search ........................... 307/303, 303.1; 361/777, 784, 791, 794, 790; 327/307, 293, 294, 296, 564, 565

[56] References Cited

U.S. PATENT DOCUMENTS

| | | | |
|---|---|---|---|
| 3,657,494 | 4/1972 | Gargini | 361/792 |
| 3,697,784 | 10/1972 | Moulding | 307/303.1 |
| 4,157,563 | 6/1979 | Bosselaar | 307/303.1 |
| 4,661,721 | 4/1987 | Ushiku | 328/105 |
| 4,700,274 | 10/1987 | Laut | 361/729 |
| 4,959,555 | 9/1990 | Schmidt | 307/303 |
| 5,070,258 | 12/1991 | Izumi et al. | 307/303.1 |
| 5,301,089 | 4/1994 | Takashima | 361/784 |

*Primary Examiner*—Terry D. Cunningham
*Attorney, Agent, or Firm*—Blakely, Sokoloff, Taylor & Zafman

[57] ABSTRACT

A trace having a closed periphery interconnect topology. The closed periphery interconnect topology can take the form of a substantially circular, oval, square, or polygon loop. An electrical signal driven onto the trace propagates in both clockwise and counter-clockwise directions around the loop. Series terminations can be implemented to optimize performance by providing better matching.

7 Claims, 8 Drawing Sheets

ELECTRICAL TRACE HAVING A CLOSED LOOP CONFIGURATION

FIELD OF THE INVENTION

The present invention pertains to the field of signal transmission. More particularly, the present invention relates to a closed loop trace topology for the transmission of electrical signals.

BACKGROUND OF THE INVENTION

In most digital devices, various integrated circuits in the form of semiconductor chips are soldered onto a printed circuit board. A number of electrical lines are used to route power, ground, and clock signals to each of these semiconductor chips. In addition, a single electrical line, a group of electrical lines, and/or a bus are typically used for the transmission of multiple electrical signals amongst the various semiconductor chips. These electrical lines and buses are known as traces or interconnections. One or more traces are used to electrically connect certain of these semiconductor chips together. Electrical signals put onto a trace by one semiconductor will propagate to the other connected semiconductor chips. By transmitting and receiving data in the form of electrical signals over the traces, the interconnected semiconductor chips can communicate with and route data amongst themselves.

For example, FIG. 1 is a block diagram illustrating a sample prior art microcomputer 100 and corresponding interconnect topology. An address bus 101, data bus 102, and control bus 103 are used to connect microprocessor 104, erasable programmable read only memory (EPROM) 105, random access memory (RAM) 106, and input/output (I/O) chip 107. Microprocessor 104 is the central processing unit for processing data according to a computer program. Computer programs are stored within EPROM 105. Data is stored by RAM 106. I/O chip 107 is used to interface microcomputer 100 with other devices (e.g., keyboard, mouse, a computer display, disk drive, printer, etc.) for inputting and outputting electrical signals. Each chip has a designated address. A particular chip is selected according to the address specified by the electrical signals on address bus 101. Data is routed amongst the chips by data bus 102. Control bus 103 regulates the flow and timing of data to and from the various chips and performs other miscellaneous control functions. Many different types of bus standards have been specified by the Institute of Electrical and Electronics Engineers (IEEE) and other organizations to facilitate the interconnection of processors, memories, and other integrated circuits.

Typically, these traces are configured in a standard open topology (SOT), having the form of a straight line segment. Semiconductor chips are typically coupled to the ends of a trace and at various points along the trace. In order to ensure that the electrical signal, which often takes the form of electrical pulses, has enough power to propagate from one semiconductor chip to any of the other semiconductor chips, drivers are typically utilized. Hence, each chip on the bus typically has a driver for driving signals onto the trace with sufficient power. In addition, each semiconductor chip typically incorporates a receiver for receiving signals transmitted on the trace.

Traces are typically routed in a semi-random fashion. No consideration is given to stub lengths or interconnect symmetry. For high speed digital designs (i.e., 50 Mhz or greater), ignoring the effects of stub lengths and symmetry could detrimentally impact the signal quality. If a semiconductor chip resides in between the two ends of the bus and a signal is driven onto the bus, the voltage of the signal is split and reflected in both directions. For example, an electrical pulse driven from EPROM 105 onto data bus 102 splits in two directions: to the right (i.e., towards I/O chip 107) and to the left (i.e., towards microprocessor 104). When the voltage reaches the two opposite end points, it is reflected back towards the middle of the bus because of the high input impedances of microprocessor 104 and I/O chip 107. Reflections from these stubs can result in signals which oscillate. Unwanted oscillations may result in erroneous data transmission.

Moreover, these oscillations may induce longer communication delays, especially in cases where signals are sent to multiple receivers (i.e., large fanout signals). This directly translates into a slower transmission rate. In the past, semiconductor chips (e.g., microprocessors, memories, I/O buffers, etc.) were relatively slow. The delays attributed to the bus were negligible in comparison to the limitations inherent to the semiconductor chips. But with the rapid advances made in the design, layout, and manufacturing process in the semiconductor field, semiconductor chips are becoming faster. The trend is towards even faster semiconductor chips in the future. It has come to a point now where the delays impaired by reflections in a typical interconnect is constraining the design of large, extremely high-speed multi-conductor networks in very large scale integration (VLSI) semiconductor architectures.

It is known in the prior art that oscillations can be minimized if stub lengths are "balanced". In other words, the placement and the lengths of the stubs should be carefully selected so that the reflections settle rapidly. However, balancing stub lengths requires an inordinate amount of time and effort. Furthermore, balancing stub lengths is a tricky and delicate operation because the procedure is extremely sensitive to small variations in lcad capacitances, interconnection characteristic impedance, and other parameters.

Oscillations can be minimized and possibly eliminated by implementing parallel terminations. For instance, a termination resistor having a resistance equal to the line's characteristic impedance at the receiving end, can be coupled to the power and/or ground line. However, adding a parallel termination dissipates DC power. Moreover, this approach is inappropriate for many complementary metal oxide semiconductor (CMOS) and transistor-transistor logic (TTL) based designs.

Oscillations can also be minimized or completely eliminated by implementing series terminations. In this approach, the resistance of a driver is matched to the characteristic impedance of the interconnection. A series resistor is implemented to compensate for any mismatches. This approach is compatible with most CMOS and TTL designs, but nevertheless, requires that the stub lengths be tuned in order for it to be effective.

Further complicating matters is the fact that the waveform for a signal depends on where its driver is located in reference to the bus. For example, the impedances seen by a particular driver varies, depending on where the driver is located in reference to the other semiconductor chips coupled onto the bus. The impedance seen from the middle of a bus is different from the impedance seen on either side of the bus. The variations in impedances causes variances in the signal waveforms. Hence, the waveform of a signal is different, depending on the location of its driver in reference to the bus.

Therefore, what is needed is an apparatus and method for minimizing reflections and its attendant oscillations. It would be preferable for such an apparatus and method to be easily implemented and to be relatively insensitive to outside parameters. It would also be highly preferable that tuning not be required.

SUMMARY AND OBJECTS OF THE INVENTION

In view of the problems associated with the transmission of data between semiconductor chips via an SOT bus, one object of the present invention is to minimize reflections in the bus.

Another object of the present invention is to minimize signal distortions in the transmission process.

Another object of the present invention is to minimize the time required for a transmitted signal to attain a voltage level sufficient to exceed a threshold for detecting valid signals.

Another object of the present invention is to provide a bus topology wherein a signal is standardized to an optimum waveform, regardless of where the signal was driven from in reference to its location on the bus.

These and other objects of the present invention are implemented in a bus having a closed periphery interconnect topology for coupling various semiconductor chips and/or other electrical components together so that they can communicate by transmitting electrical signals onto the bus and receiving electrical signals from the bus. The bus is configured so that it loops back on itself so that there are no end points. When a signal is driven onto the bus, it propagates in both clockwise and counter-clockwise directions through the bus. The closed periphery interconnect topology can be implemented in a substantially circular, oval, square, or rectangular loop. Furthermore, the bus can be used to couple together electrical components residing on different signal layers of a printed circuit board. In one embodiment, series terminations are implemented to optimize matching the driver resistance to equal half of the characteristic impedance of interconnections comprising the closed periphery interconnect topology.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A closed periphery interconnect topology (CPIT) for the transmission of electrical signals is described. In the following description for purposes of explanation, numerous specific details are set forth, such as frequencies, velocities, transmission line lengths, settling times, etc., in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention. It should also be noted that the present invention pertains to traces and interconnects such as single electrical lines, groups of multiple electrical lines, as well as buses.

Figure 1:
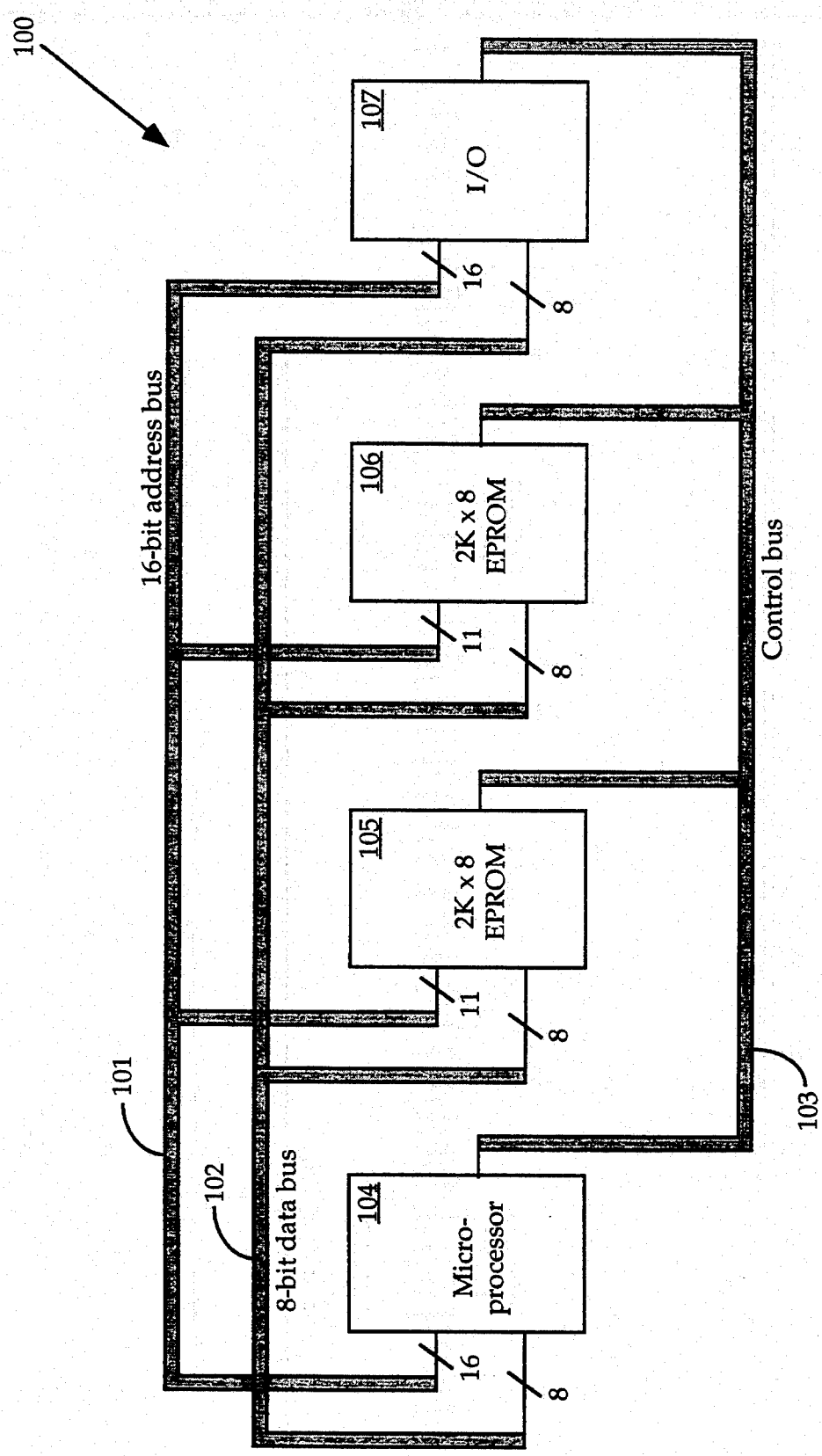
FIG. 1 is a block diagram illustrating a prior art microcomputer and corresponding interconnect topology.
Figure 2A:
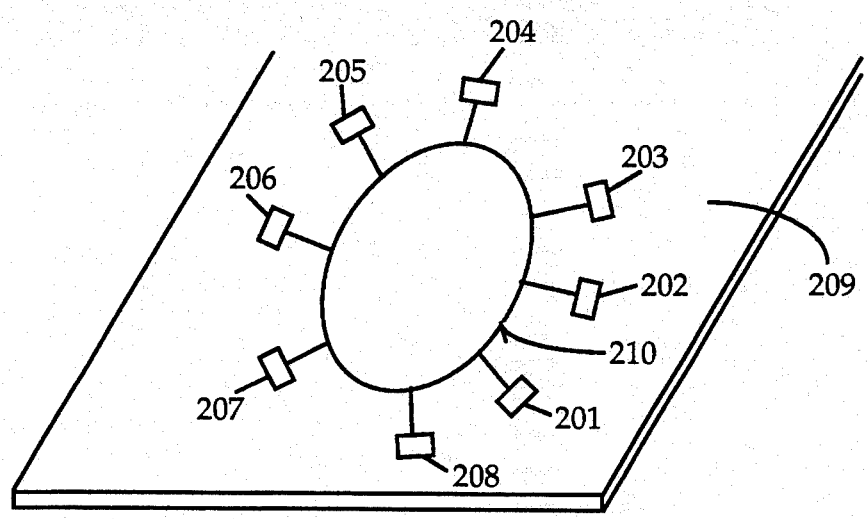
FIG. 2A is a block diagram illustrating one embodiment of the closed periphery interconnect bus of the present invention, wherein a circular loop is implemented.

FIG. 2A is a block diagram illustrating one embodiment of a CPIT trace of the present invention. A number of semiconductor chips 201–208 are soldered onto a printed circuit board 209. These semiconductor chips can include microprocessors, memories, input/output interfaces, floppy/hard disk controllers, cache controllers, etc. Each of the semiconductor chips 201–208 are coupled to CPIT trace 210. Each of the semiconductor chips 201–208 can be either a source or a load. When one of the semiconductor chips 201–208 drives a signal onto trace 210, the signal propagates in both clockwise and counter-clockwise directions.

Figure 2B:
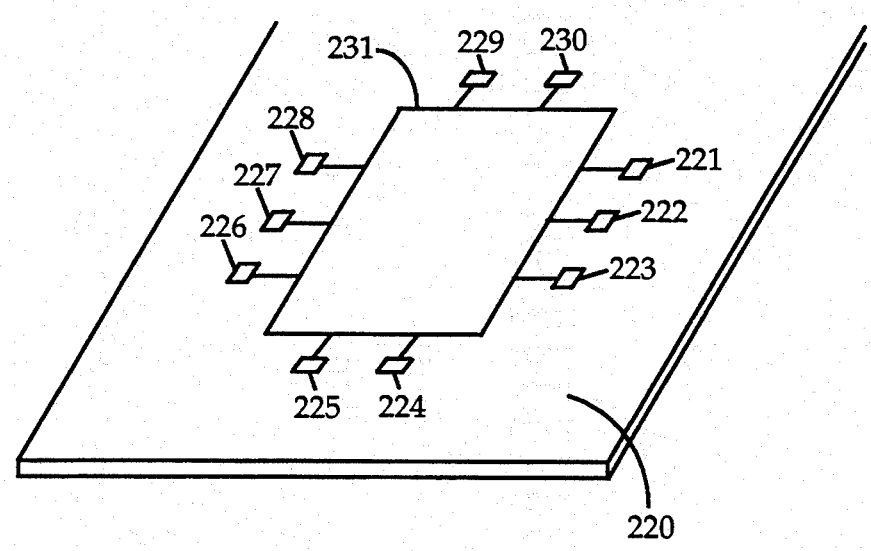
FIG. 2B is a block diagram illustrating another embodiment of the present invention, wherein a substantially rectangular loop is implemented.

The present invention can also be implemented in a substantially square or rectangular interconnect topology embodiment as shown in FIG. 2B. The semiconductor chips 221–230 are soldered onto printed circuit board 220 and are coupled to trace 231. The CPIT trace 231 has a substantially square or rectangular shape. Signals driven onto trace 231 by any of the semiconductor chips 221–230 propagates in both clockwise and counter-clockwise directions.

Figure 3:
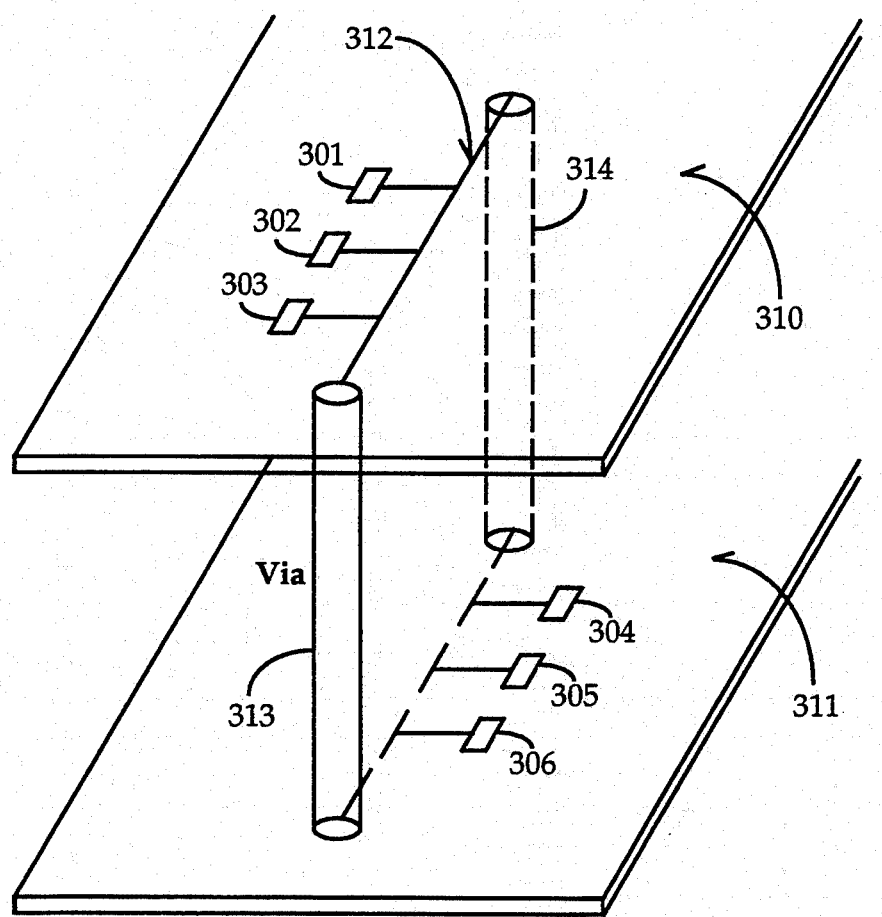
FIG. 3 is a block diagram illustrating another embodiment of the present invention, wherein the bus couples electrical components residing on different signal layers.

A printed circuit board can be made up of several different layers for conducting signals. The CPIT trace of the present invention can be used to interconnect several of these layers. FIG. 3 shows a CPIT trace that runs between two different signal layers. A number of semiconductor chips 301–303 are mounted onto a first signal layer 310, while other semiconductor chips 304–306 are mounted onto a second signal layer 311. All six semiconductor chips 301–306 are coupled to the same trace 312. Trace 312 runs through the two vias 313 and 314, thereby connecting the segment of trace 312 on layer 310 to the segment of trace 312 on layer 311. Thus, trace 312 has a closed periphery interconnect topology: trace 312 is coupled to the semiconductor chips 301–303 on layer 310, runs through via 313, couples semiconductor chips 304–306 on layer 311, runs through via 314, and is coupled back to those semiconductor chips 301–303 on layer 310. Note that the present invention can likewise be implemented in printed circuit boards having multiple signal layers by implementing multiple vias to couple the trace to the various layers.

Figure 4A:
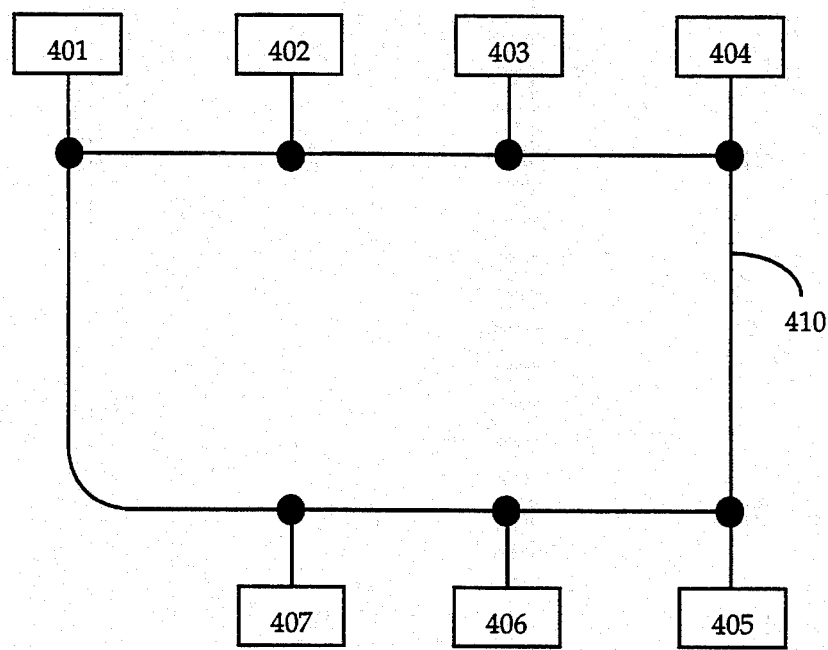
FIG. 4A shows one embodiment of the present invention.
Figure 4B:
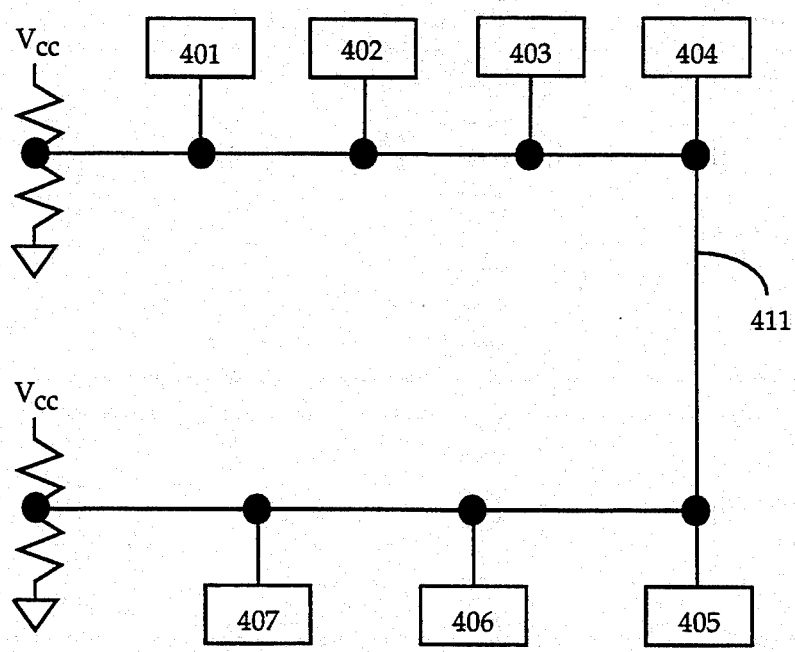
FIG. 4B shows a typical prior art bus having a standard open topology.

FIG. 4A shows one embodiment of a CPIT trace. Seven semiconductors 401–407 are coupled to trace 410. In contrast, FIG. 4B represents these same seven semiconductors 401–407 being coupled to a typical prior art trace having a standard open topology 411. Traces 410 and 411 are comprised of copper tracks.

Figure 5:
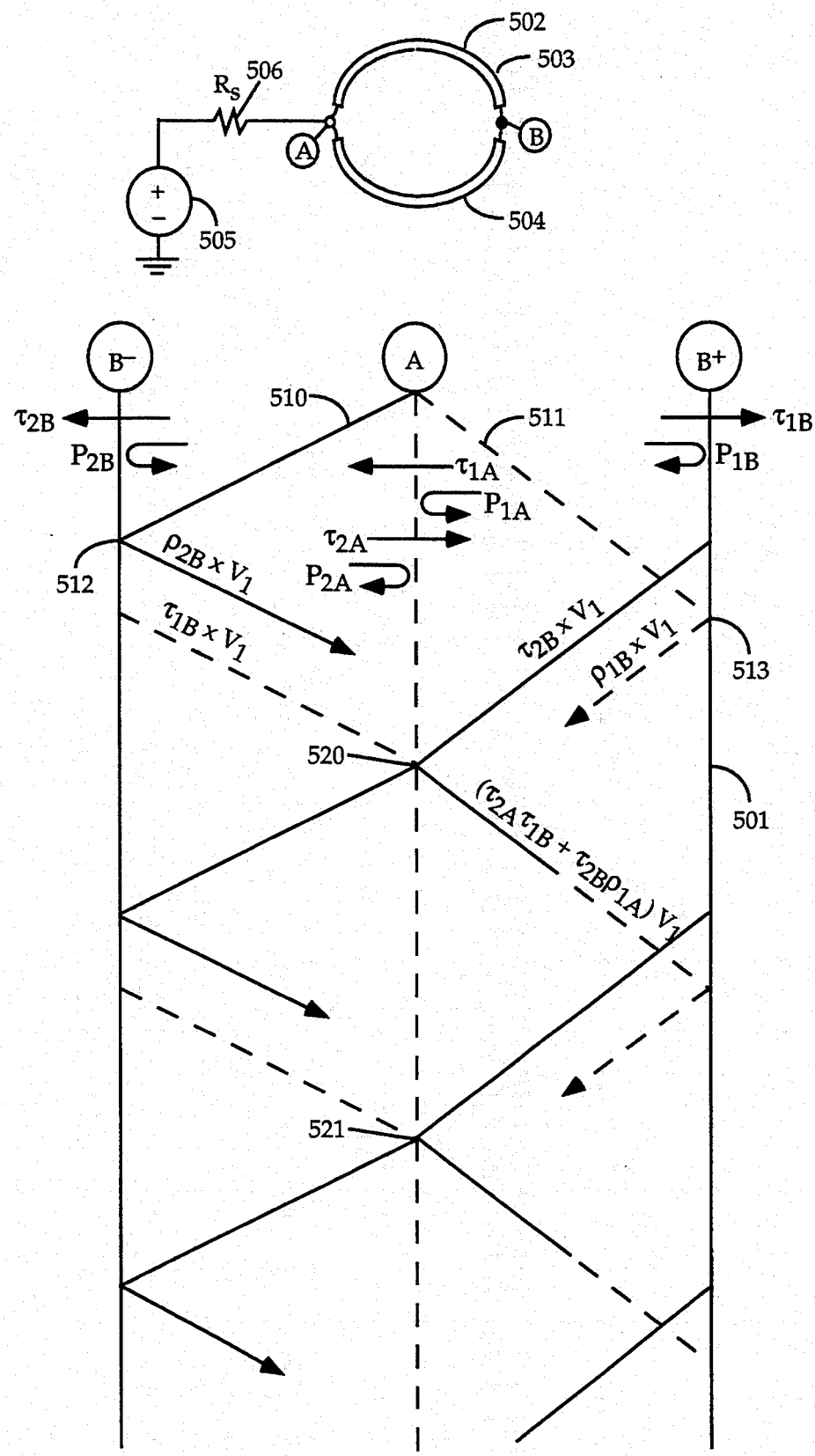
FIG. 5 illustrates a lattice diagram for a closed periphery interconnect topology bus having a asymmetrical loop.

The following description analyzes the characteristics of a CPIT trace. FIG. 5 illustrates a lattice diagram 501 being applied to the analysis of a CPIT trace 502. The trace used in this example consists of two halves 503–504, having an impedance, velocity, and time delay of $Z_{01}$, $v_1$, and $T_{D1}$, respectively for the upper half 503, and $Z_{02}$, $v_2$, and $T_{D2}$ respectively for the lower half 504. Both halves have equivalent lengths. The loop is being driven by an ideal step voltage source 505, which outputs a 1.0 volt step signal. Voltage source 505 has an output impedance represented by 506.

In regards to the lattice diagram 501 corresponding to trace 502, the location on the trace is indicated by the horizontal position on the lattice. Location A on the loop corresponds to the center of the lattice diagram. Location B on the loop corresponds to both the left (B−) and right (B+) sides of the lattice diagram. The right half of the lattice diagram corresponds to the upper portion 503 of the loop, and the left half corresponds to the lower portion 504.

In analyzing the characteristics of trace 502, imagine that lattice diagram 501 is rolled up into a cylinder, so that a wave propagating past location B on trace 502 appears to jump from one side of the lattice diagram 501 to the other side. Hence, beginning at point A, a wave launched onto trace 502 propagates simultaneously in both directions. On lattice diagram 501, this is indicated by showing two vectors 510 and 511 initiated at point A. Vector 511, represented as a dashed line, points to the right. Vector 510, represented by a solid line, points to the left. Vector 511 indicates the wavefront propagating from point A to point B via the upper half of the trace 503. When this vector reaches point B on the lattice, it jumps to the left side of the diagram, and continues propagating from left to right.

All vectors occupying the right side of the lattice diagram have slopes proportional to the velocity $v_1$ of the upper half of the loop, and all vectors occupying the left side of the lattice diagram have slopes proportional to the velocity $v_2$ of the lower half.

If $Z_{01}$ is not equivalent to $Z_{02}$, a reflection is generated at 512 of point B. This reflection points back in the opposite direction. However, on a typical CPIT trace, $Z_{01}$ is approximately equal to $Z_{02}$. Consequently, the amplitude of these reflections will be relatively small.

Referring back to vector 511, and tracing it from its initiation at point A, vector 511 continues to the right to 513 of point B, jumps to the left side of the diagram, and continues back to point A. Vector 510, propagating to the left from point A, also eventually returns to point A. As a result, one characteristic of the CPIT trace is that the predominant wavefronts return to point A at the same time. Both vectors always arrive simultaneously at point A, regardless of the symmetry of the CPIT trace.

This is shown in lattice diagram 401 as points 520 and 521.

This is a key attribute of the CPIT trace and explains why its electrical performance offers advantages over the performance of traces having open topologies. The wavefronts initiated at point A will always return simultaneously back at point A. By returning simultaneously, the wavefronts combine together. Their combined "energy" is "forced" across the resistance of the voltage source and across any additional series termination resistor. This resistance is then allowed to dissipate the energy in the wavefront, helping to eliminate any subsequent reflections. In other words, when the waves return to the driver, if they simultaneously reach the driver and given an appropriate driver resistance, the waves combine in a manner which "cancels" out any further reflections.

This makes series termination techniques effective. Performance is optimized when the driver resistance is equal to half of the characteristic impedance of the interconnections comprising the CPIT. Note that the driver resistance is not a function of the driver's location on the CPIT. This matching can be achieved by adding a series resistance to the driver, as necessary. Hence, the signal will be settled and will cease to propagate after it has completed one round-trip about the loop.

If the wavefronts did not arrive simultaneously back at point A, they would not combine in this manner. Only a fraction of the "energy" in each wavefront would be dissipated across the source resistance. The remaining energy would continue propagating around the CPIT trace. The effect of this would be oscillations or "ringing" at various locations about the CPIT trace.

The behavior described above can also be described mathematically. In the ideal situation, a clockwise wave combines with a counterclockwise wave such that they cancel each other. This will result in a lattice diagram which shows only the first two pairs of vectors, because all subsequent vectors will be equal to zero. To achieve this, the goal is to arrive at a zero value for the third vector pair (i.e., $V1[\tau_{2A}(\rho_{2B}+\tau_{1B})+\rho_{1A}(\rho_{1B}+\tau_{2B})]=0$. It will be demonstrated that this situation occurs when $R_s=(Z_{01} \| Z_{02})$, that is, when the CPIT is "matched-at-source". In the following description, $\tau$ represents the transmission coefficient. When a wave passes a discontinuity, such as at point A of FIG. 6, a portion of it is reflected back toward the direction from whence it originated. A portion continues past the discontinuity. The reflected portion is described by the reflection coefficient, $\rho$. The "transmitted" portion is described by the transmission coefficient, $\tau$.

In the mathematical analysis, reflection and transmission coefficients are defined at points A and B on the CPIT trace. At point B, the reflection coefficient for a wave traveling clockwise around the loop (i.e., left-to-right on the lattice diagram) is given by:

$$\rho_{1B} = \frac{Z_{02} - Z_{01}}{Z_{02} - Z_{01}}$$

The transmission coefficient at B, for the same wave, is given by:

$$\tau_{1B} = 1 + \rho_{1B} = \frac{2Z_{01}}{Z_{02} + Z_{01}}$$

These expressions are used to analyze the behavior of a wave propagating around the CPIT trace. Beginning at point A, the amplitude of a wave propagating in the clockwise direction is given by the voltage divider equation for $R_s$ connected in series with the CPIT trace:

$$V_1 = V_S \frac{(Z_{01} \| Z_{02})}{R_S + (Z_{01} \| Z_{02})} = V_S \frac{Z_{01}Z_{02}}{R_SZ_{01} + R_SZ_{02} + Z_{01}Z_{02}}$$

The lattice diagram 501 shows that when this wave passes point B, it is multiplied by $\tau_{2A}$. Thus, the amplitude of this wave after it has returned to and passed point A is $V_1\tau_{1B}\tau_{2A}$.

At the same time in which $V_1$ is launched in the clockwise direction, a wave is also launched in the counter-clockwise direction. Its amplitude depends on the same voltage divider equation as $V_1$. Hence, its amplitude is also $V_1$. This wave is multiplied by $\tau_{2B}$ when it passes point B. When it reaches point A, a reflection is generated, thereby multiplying the wave's amplitude by $\rho_{1A}$. A clockwise-traveling wave with an amplitude of $V_S\tau_{2B}\rho_{1A}$ is produced.

The clockwise-traveling wave and the counter-clockwise-traveling wave arrive at point A simultaneously. Their combination results in a clockwise-traveling wave having an amplitude of:

$$V_{Result} = V_1(\tau_{1B}\tau_{2A} + \tau_{2B}\rho_{1A})$$

In one embodiment, the source impedance $R_s$ is chosen so as to make $V_{Result}$ equal to zero. This approach is similar to the implementation of series termination on a SOT trace. The intent is to eliminate subsequent reflections at the source.

An asymmetric trace can be modeled as consisting of two regions having different characteristic impedances and propagation velocities (i.e., $Z_{01} \neq Z_{02}$ and $V_1 \neq V_2$). Asymmetries can result from the load capacitance due to components on the trace that affects the characteristic impedance and velocity of various portions of the trace. It is difficult to optimize the trace performance because the wavefront cannot be completely eliminated following one round trip. Furthermore, reflections are generated at point B. These reflections cause high frequency noise similar to the high frequency noise resulting from asymmetry associated with SOT traces. Similarly, for a wave traveling counter-clockwise, $$\rho_{2B} = \frac{Z_{01} - Z_{02}}{Z_{01} + Z_{02}}$$

and $$\tau_{2B} + \frac{2Z_{01}}{Z_{01} + Z_{02}}$$

At point A, the reflection and transmission coefficients are slightly more complicated, as the source resistance $R_s$ is factored in. For a wave traveling in a clockwise direction (i.e., left-to-right on the Lattice Diagram), the reflection coefficient is:

$$\rho_{2A} = \frac{(R_S \| Z_{01}) - Z_{02}}{(R_S \| Z_{01}) + Z_{02}} = \frac{R_SZ_{01} - R_SZ_{02} - Z_{01}Z_{02}}{R_SZ_{01} + R_SZ_{02} + Z_{01}Z_{02}}$$

The Transmission coefficient is:

$$\tau_{2A} = 1 + \rho_{2A} = \frac{2R_SZ_{01}}{R_SZ_{01} + R_SZ_{02} + Z_{01}Z_{02}}$$

In the above formulas, the expression $R_S \| Z_{01}$ is used to indicate the resistance resulting from the parallel combination of $R_S$ and $Z_{01}$. The reflection and transmission coefficients at point A for a wave traveling in the counter-clockwise direction are:

$$\rho_{1A} = \frac{(R_S \| Z_{02}) - Z_{01}}{(R_S \| Z_{02}) + Z_{01}} = \frac{-R_SZ_{01} + R_SZ_{02} - Z_{01}Z_{02}}{R_SZ_{01} + R_SZ_{02} + Z_{01}Z_{02}}$$

$$\tau_{1A} = 1 + \rho_{1A} = \frac{2R_SZ_{02}}{R_SZ_{01} + R_SZ_{02} + Z_{01}Z_{02}}$$

Figure 6:
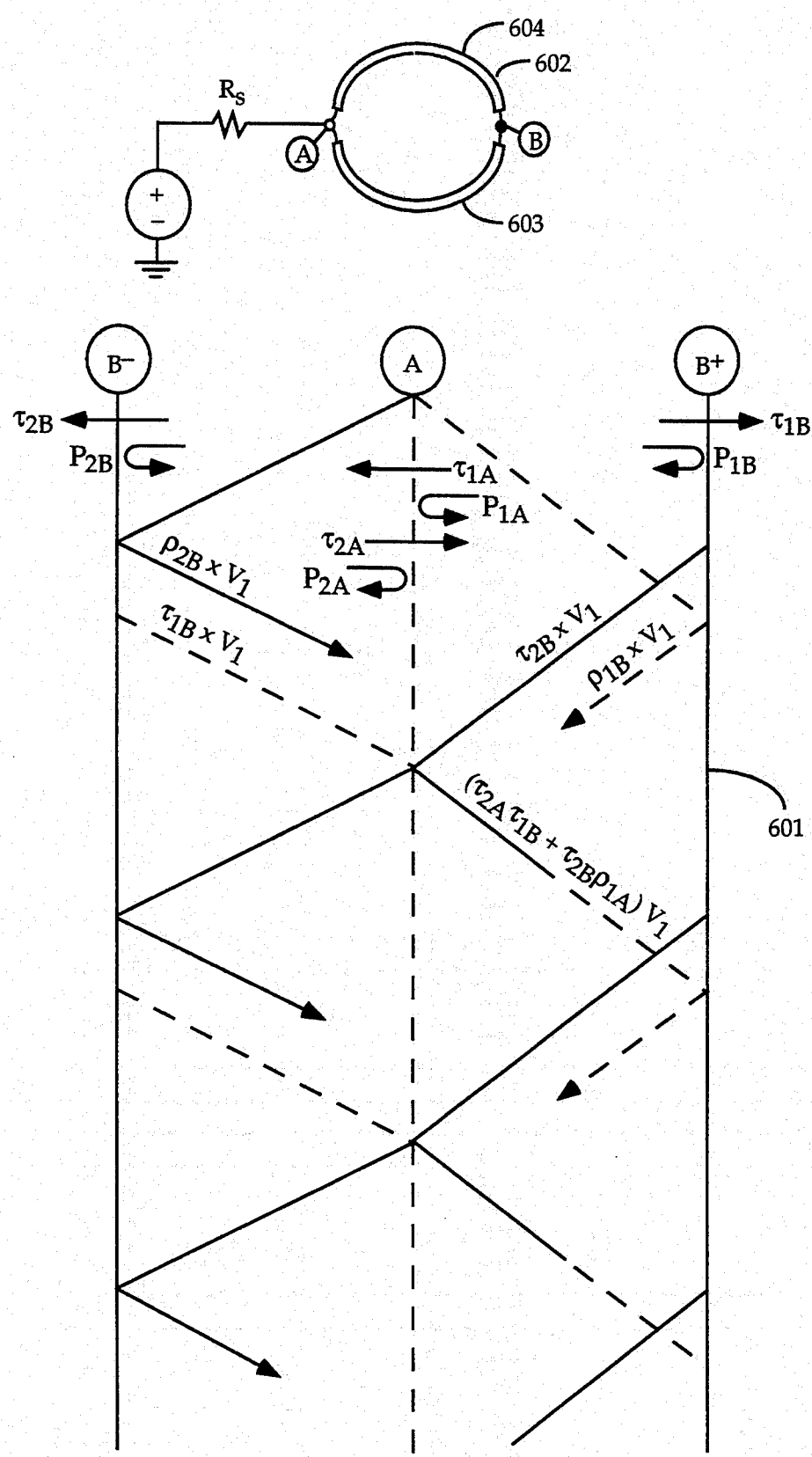
FIG. 6 illustrates a lattice diagram for a closed periphery interconnect topology bus having two halves of the loop with equivalent impedances but different velocities.

In FIG. 6, the two halves 603 and 604 of the CPIT trace 602 have equivalent impedances, but their velocities are different (i.e., $Z_{01} = Z_{02}$ and $V_1 \neq V_2$). According to the lattice diagram 601, no reflections are generated at point B because the two impedances are equal. Once a signal has completed one trip around the loop and has passed point A, its amplitude is:

$$V_{Result}V_1(\tau_{1B}\tau_{2A} + \tau_{2B}\rho_{1A})$$

From the identities of the transmission coefficients as described above, $\tau_{1B} = \tau_{2B} = 1$ when $Z_{01} = Z_{02}$. The value of $V_{Result}$ is simplified to:

$$V_{Result} = V_1(\tau_{2A} + \rho_{1A}) = V_1 \frac{R_SZ_{01} + R_SZ_{02} - Z_{01}Z_{02}}{R_SZ_{01} + R_SZ_{02} + Z_{01}Z_{02}}$$

Further reduction produces:

$$V_{Result} = V_1 \frac{R_S - \frac{Z_{01}Z_{02}}{Z_{01} + Z_{02}}}{R_S + \frac{Z_{01}Z_{02}}{Z_{01} + Z_{02}}} = V_1 \frac{R_S - (Z_{01} \| Z_{02})}{R_S + (Z_0 \| Z_{02})}$$

This expression is equivalent to the situation wherein the voltage source is connected to a single line having an impedance equal to the parallel combination of $Z_{01}$ and $Z_{02}$. This indicates that the matched-at-source condition occurs for a situation wherein the two halves of a CPIT trace have equivalent impedances but different velocities when:

$$R_s = (Z_{01} \| Z_{02})$$

The CPIT trace is over-driven (i.e., initiation of decaying oscillations) when:

$$R_s < (Z_{01} \| Z_{02})$$

The CPIT trace is under-driven (i.e., the voltage rises asymptotically to a final value) when:

$$R_s < (Z_{01} \| Z_{02})$$

Figure 7:
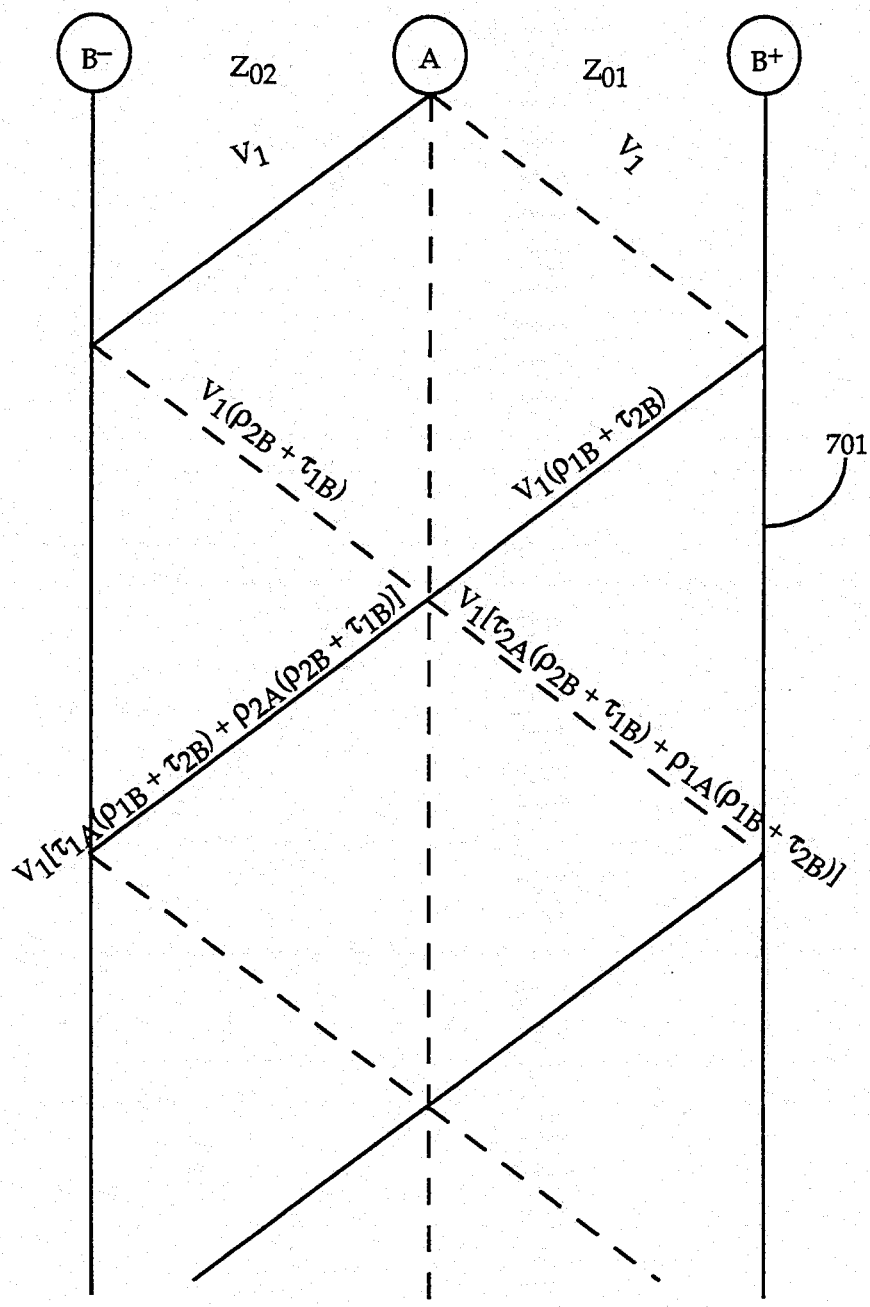
FIG. 7 illustrates a lattice diagram for a closed periphery interconnect topology bus having two halves of the loop with equivalent velocities but different impedances.

In FIG. 7, the two halves 703 and 704 of the CPIT trace 702 have equal velocities, but their impedances are different (i.e., $Z_{01} \neq Z_{02}$ and $V_1 = V_2$). According to the lattice diagram 701 corresponding to this situation, a reflection occurs whenever a wave passes point B. However, because of the matched velocities, this reflected wave aligns with a transmitted wave coming from the other direction. After a signal has completed one revolution about the CPIT trace 704 and has passed point A, its amplitude is given by:

$$V_{Result} = V_1[\tau_{2A}(\rho_{2B}+\tau_{1B})+\rho_{1A}(\rho_{1B}+\tau_{2B})]$$

According to the definitions assigned to the $\rho_{2B}$, $\tau_{1B}$, $\rho_{1B}$, and $\tau_{2B}$ terms, the following expression results:

$$(\rho_{2B}+\tau_{1B}) = (\rho_{1B}+\tau_{2B}) = \frac{Z_{02}+Z_{01}}{Z_{02}+Z_{01}} = 1$$

Substituting this expression back into the $V_{Result}$ equation yields:

$$V_{Result} = V_1[\tau_{2A}+\rho_{1A}]$$

As described above, this equation can be manipulated into the following form:

$$V_{Result} = V_1 \frac{R_S - (Z_{01} \| Z_{02})}{R_S + (Z_{01} \| Z_{02})}$$

Consequently, for the situation wherein the two halves of the CPIT trace have equal velocities but different impedances, the CPIT trace is matched at source when:

$$R_s = (Z_{01} \| Z_{02})$$

The CPIT trace is over-driven (i.e., the initiation of damped oscillations) when:

$$R_s < (Z_{01} \| Z_{02})$$

The CPIT trace is under-driven when:

$$R_s > (Z_{01} \| Z_{02})$$

Therefore, asymmetries in a CPIT trace might be noisy because of their inability to dampen the resulting reflections. However, these noise problems are less than the noise associated with asymmetric SOT traces. In the CPIT trace, "asymmetry" noise is caused by reflections occurring at point B. These reflections are minimized because $Z_{01} \approx Z_{02}$.

In general, if the two halves of the CPIT trace have different impedances they will also have different velocities. However, the difference in velocity can be compensated by adjusting the length of each half of the trace. Once the line lengths have been adjusted, the source impedance is adjusted so that it is equal to the parallel combination of the two characteristic impedances. One way for accomplishing this is to add series terminations.

Figure 8:
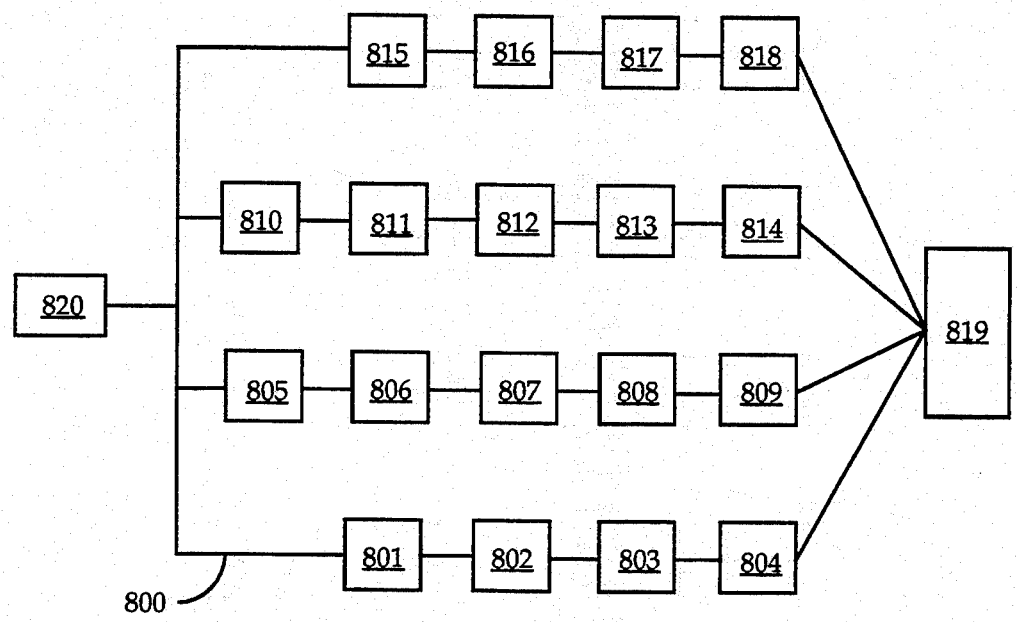
FIG. 8 illustrates another embodiment of the present invention, wherein the present invention is utilized in a large multi-port network.

FIG. 8 illustrates another embodiment of the present invention wherein a trace 800 is implemented for coupling all the various components or devices 801–819 in a closed periphery interconnect topology for a large multi-port network. The network can be driven by a generator 820 while components 801–819 are in a load mode. For instance, the multi-port network might comprise a microprocessor 820, cache controller 819, and static random access memories 801–818.

Figure 9:
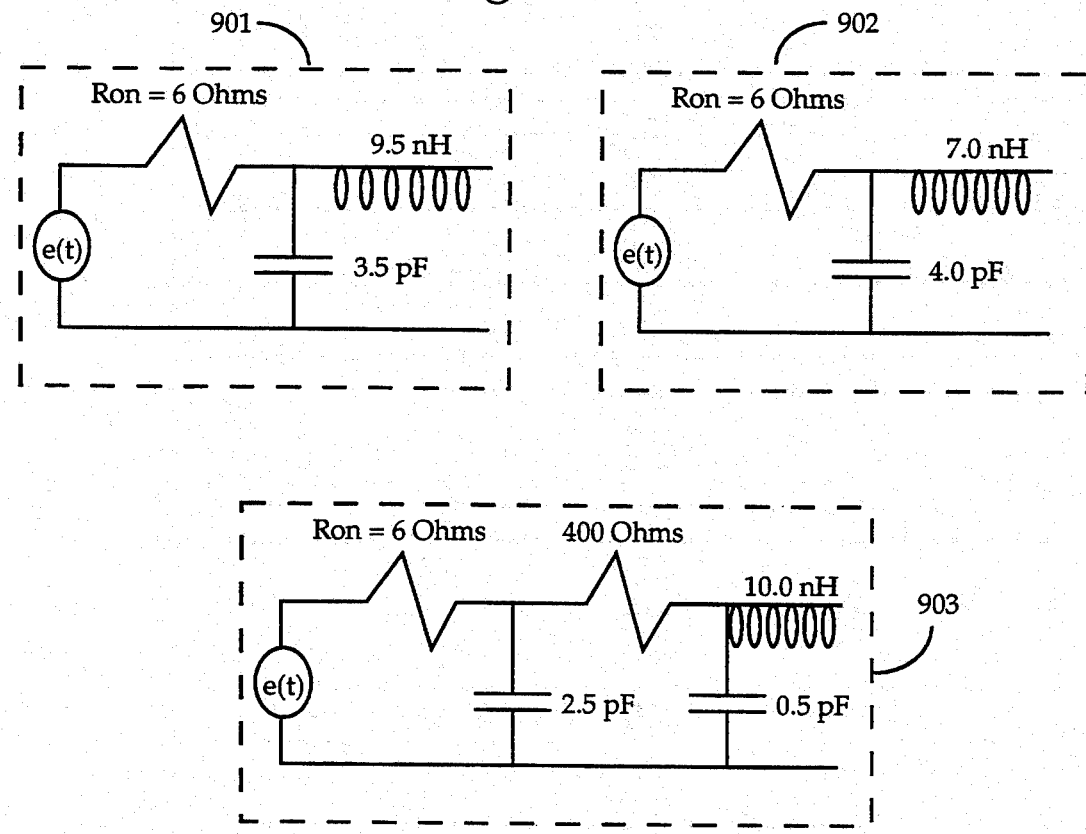
FIG. 9 illustrates electrical equivalents for modeling a driver, electrical components, and loads on a bus.

FIG. 9 shows the electrical equivalents used to model the driver, components, and load. The generator is modeled by an equivalent circuit 901. The receivers are modeled by an equivalent circuit 902. The load is modeled by an equivalent circuit 903. By modeling the devices as the linear combination of R, L, C, and G, the network can be analyzed in the frequency domain.

In summary, the electrical characteristics of the CPIT allow oscillations and reflections to settle rapidly. This results in better signal quality. Because of the inherent signal quality of the CPIT, it is typically not necessary to tune the lengths of any of the segments comprising the CPIT, nor to optimize the placement of the devices coupled to the CPIT. As a result, very short interconnects can be implemented. Short interconnects translates into short delay times.

Moreover, because of the inherent signal quality, the performance of the CPIT is relatively insensitive to variations in loading as well as other parameters. In order to optimize the signal quality, the driver resistance is matched to the CPIT's loop impedance. The driver resistance should be set equal to half of the characteristic impedance of the interconnections of the loop.

In the present invention, current loops are not a major concern. Generally, current loops occur when there exists more than one electrical path for carrying the return of the ground current back to the source. In cases where the intended ground return path does not carry all the ground current, potential radiation and safety problems may occur. Such cases are often referred to as unbalanced signal lines. In the CPIT layout of the present invention, however, even though the signal from the source is launched into a loop, there are no unbalanced ground return paths because the ground current returns to the source through the ground plane of the printed circuit board. Since there is only one ground path return in the CPIT layout, current loops problems are minimal in the present invention.

Thus, a closed periphery interconnect trace is disclosed.

What is claimed is:

1. A printed circuit board having a plurality of semiconductors for processing digital data, a plurality of transmission lines coupled to said semiconductors for supplying power and ground to said semiconductors, and a trace coupled to said semiconductors, wherein a digital signal transmitted onto said trace by one of said semiconductors propagates through said trace and is received by another semiconductor coupled to said trace, said trace comprising a continuous closed periphery topology having no endpoints, wherein a digital signal driven onto said trace simultaneously propagates in both a clockwise direction and a counter-clockwise direction and wherein said closed periphery topology is used to couple a semiconductor mounted on a first signal layer of said printed circuit board to another semiconductor residing on a different signal layer of said printed circuit board.

2. The printed circuit board of claim 1, wherein said closed periphery topology of said trace is substantially rectangular.

3. The printed circuit board of claim 1, wherein said closed periphery topology of said trace is substantially polygon.

4. A computer system having a transmission line for transmitting information between a microprocessor, a memory, and an input/output interface mounted on a multi-layered printed circuit board, said transmission line having a closed loop topology extending through at least two layers of said multi-layered printed circuit board, said transmission line interconnecting said microprocessor, said memory, and said input/output interface, wherein a signal driven onto said transmission line splits into a first waveform propagating in a clockwise direction through said transmission line and a second waveform propagating through said transmission line in a counter-clockwise direction and wherein said first waveform combines with said second waveform to minimize subsequent reflections.

5. The computer system of claim 4 further comprising a terminating means coupled to said transmission line for matching impedances of said microprocessor, said memory, and said input/output interface to an impedance of said transmission line.

6. The computer system of claim 5, wherein said closed loop topology is substantially rectangular.

7. The computer system of claim 6, wherein said closed loop topology is substantially polygon.

* * * * *

UNITED STATES PATENT AND TRADEMARK OFFICE
CERTIFICATE OF CORRECTION

PATENT NO. : 5,438,297
DATED : August 1, 1995
INVENTOR(S) : Rahal-Arabi et al.

It is certified that error appears in the above-indentified patent and that said Letters Patent is hereby corrected as shown below:

In column 2 at line 42 delete "lcad" and insert --load--

In column 8 at line 25 delete "$V_{Result}V_1$" and insert --$V_{Result}=V_1$--

In column 8 at line 39 delete "$Z_0$" and insert --$Z_{01}$--

Signed and Sealed this

Twentieth Day of August, 1996

Attest:

BRUCE LEHMAN

Attesting Officer     Commissioner of Patents and Trademarks